US008242382B2

(12) United States Patent
van den Hoek et al.

(10) Patent No.: US 8,242,382 B2
(45) Date of Patent: Aug. 14, 2012

(54) METHOD AND APPARATUS FOR MANUFACTURE OF VIA DISK

(75) Inventors: Willibrordus G. van den Hoek, Saratoga, CA (US); Michael J. Kilkelly, Wakefield, MA (US); Barbara Kilkelly, legal representative, Wakefield, MA (US); Dane Fawkes, Salem, MA (US); Felix Twaalfhoven, Marblehead, MA (US)

(73) Assignee: Innovent Technologies, LLC, Peabody, MA (US)

( * ) Notice: Subject to any disclaimer, the term of this patent is extended or adjusted under 35 U.S.C. 154(b) by 216 days.

(21) Appl. No.: 12/362,693

(22) Filed: Jan. 30, 2009

(65) Prior Publication Data

US 2009/0188707 A1 Jul. 30, 2009

Related U.S. Application Data

(60) Provisional application No. 61/024,708, filed on Jan. 30, 2008.

(51) Int. Cl.
*H01K 3/10* (2006.01)
*H05K 1/11* (2006.01)

(52) U.S. Cl. .......................................... 174/262; 29/852

(58) Field of Classification Search .................. 174/257, 174/262–266; 29/852
See application file for complete search history.

(56) References Cited

U.S. PATENT DOCUMENTS 3,852,877 A 12/1974 Ahn et al.
4,828,008 A 5/1989 White et al.
4,828,808 A 5/1989 Duncan et al.
4,861,641 A 8/1989 Foster et al.
4,942,076 A 7/1990 Panicker et al.
5,011,725 A 4/1991 Foster
5,046,238 A 9/1991 Daigle et al.
5,071,359 A 12/1991 Arnio et al.
5,111,870 A 5/1992 Cook
5,111,871 A 5/1992 Cook
5,285,570 A 2/1994 Fulinara
5,287,619 A 2/1994 Smith et al.
5,322,109 A 6/1994 Cornie
5,329,695 A 7/1994 Traskos et al.
5,340,947 A 8/1994 Credle et al.
5,440,805 A 8/1995 Daigle et al.
5,586,385 A * 12/1996 Nishino et al. ............. 29/603.16
5,707,575 A 1/1998 Litt et al.
6,050,829 A 4/2000 Eldridge et al.
6,114,240 A 9/2000 Akram et al.
6,148,899 A 11/2000 Cornie et al.

(Continued)

OTHER PUBLICATIONS

International Search Report, International Application No. PCT/US2009/032553, with the Written Opinon of the International Searching Authority dated Jun. 17, 2009.

(Continued)

*Primary Examiner* — Jeremy Norris
(74) *Attorney, Agent, or Firm* — Goodwin Procter LLP

(57) ABSTRACT

Aluminum filled via disks are manufactured utilizing a plurality of drilled substrates placed into a metal can in a stacked, interdisposed assembly with a corresponding number of graphite molds. Aluminum infiltration ingots are added and the can is heated to a temperature to melt the ingots. The molten aluminum is pressurized so that it flows into the vias. The substrates are then cooled, removed from the can, separated from between the graphite molds, and the flat surface faces are ground and polished to expose the filled vias.

34 Claims, 8 Drawing Sheets

U.S. PATENT DOCUMENTS

| | | | | |
|---|---|---|---|---|
| 6,215,321 | B1 | 4/2001 | Nakata | |
| 6,318,442 | B1 | 11/2001 | Cornie | |
| 6,355,340 | B1 | 3/2002 | Singh et al. | |
| 6,360,809 | B1 | 3/2002 | Cornie et al. | |
| 6,498,381 | B2 | 12/2002 | Halahan et al. | |
| RE38,062 | E | 4/2003 | Fulinara et al. | |
| 6,583,058 | B1 | 6/2003 | Rajendran et al. | |
| 6,620,731 | B1 | 9/2003 | Farnworth et al. | |
| 6,624,003 | B1 | 9/2003 | Rice | |
| 6,765,400 | B2 | 7/2004 | Ido | |
| 6,812,718 | B1 | 11/2004 | Chong et al. | |
| 6,852,627 | B2 | 2/2005 | Sinha et al. | |
| 6,861,858 | B2 | 3/2005 | Chen et al. | |
| 6,886,248 | B2 * | 5/2005 | Watanabe et al. | 29/852 |
| 7,169,465 | B1 | 1/2007 | Karandikar et al. | |
| 7,244,034 | B1 | 7/2007 | Karandikar et al. | |
| 2001/0023597 | A1 * | 9/2001 | Elledge | 65/60.5 |
| 2003/0146019 | A1 * | 8/2003 | Hirai | 174/257 |
| 2004/0017005 | A1 * | 1/2004 | Kobayashi et al. | 257/707 |
| 2004/0177996 | A1 * | 9/2004 | Karavakis et al. | 174/257 |
| 2005/0064707 | A1 | 3/2005 | Sinha | |
| 2005/0092709 | A1 | 5/2005 | Chun et al. | |
| 2005/0121768 | A1 | 6/2005 | Edelstein et al. | |
| 2006/0162955 | A1 * | 7/2006 | Crippen | 174/250 |
| 2006/0231591 | A1 * | 10/2006 | Gruber et al. | 228/101 |
| 2007/0187142 | A1 * | 8/2007 | Suemasu et al. | 174/262 |
| 2007/0246249 | A1 * | 10/2007 | Kano et al. | 174/257 |

OTHER PUBLICATIONS

Eric Bogatin, Roadmaps of Packaging Technology, Ch. 11 (Integrated Circuit Engineering Coporation, 1997).

Official Communication from European Patent Office, Application No. 09 705 309.4-2216, dated Jun. 7, 2011, 4 pages.

* cited by examiner

METHOD AND APPARATUS FOR MANUFACTURE OF VIA DISK

CROSS REFERENCE TO RELATED APPLICATION

This application claims priority under 35 U.S.C. §119(e) to U.S. Provisional Patent Application Ser. No. 61/024,708, filed Jan. 30, 2008, the disclosure of which is hereby incorporated by reference herein in its entirety.

BACKGROUND OF THE INVENTION

A ceramic via disk is a circular alumina substrate that includes a large number of closely spaced, precisely located holes or vias formed therethrough. These vias are filled with conductive material to provide isolated conductive regions through the insulating ceramic substrate. The disk can be scaled to match the size of a semiconductor wafer.

Ceramic via disks are well-suited for probe card applications, specifically to facilitate space transformation. The probe card is a custom-designed interface that provides electrical signal paths between the test system and circuits on a wafer, thereby permitting the testing and validation of the circuits at wafer level, before the wafers are cut into individual integrated circuits and subsequently packaged. Probe cards typically include contact elements or probe assemblies (needles, wires, probes, etc) along with space transformers, interposers, and PCBs/stiffeners.

The function of the space transformer is to enable contact between the bond pads on a single semiconductor device (die), a plurality of dice, or over an entire wafer (if wafer-scale integration is employed for the unit under test) and then route the electrical connection to the terminals found on printed circuit boards.

The space transformer may be constructed using many formats including, but not limited to, multi-layer tape cast ceramics, single-layer fully-fired (hardened) ceramics with thin or thick film build-up techniques, printed circuit boards or BT Resin cores with build-up layers (e.g., multi-layer organic), where each offers alternating layers of circuit metalization and dielectric, with metalized through vias providing connection between each of the layers.

One problem associated with these techniques is an inability to maintain sufficient planarity and surface parallelism as dimensions increase beyond 4-6 inches in length or width. In addition, as thickness increases, vertical routing requires the use of multiple dielectric layers and the maintenance of electrical continuity and support of high performance signals becomes a challenge.

Ceramic based multi-layer circuit boards provide superior electrical properties as compared to organic printed circuit boards and are employed in higher performance applications. One commonly practiced technology for fabricating multi-layer substrates uses co-fired tape cast ceramics. The co-fired ceramic structure is a monolithic ceramic substrate after it has been completely fired. According to a high temperature version of this technique, commonly known as high temperature co-fired ceramic (HTCC), a mixture of 90%-95% alumina ($Al_2O_3$) and glass is fired at about 1,600° C. with tungsten or molybdenum-based metal paste. Alternatively, a high-glass concentration ceramic, commonly known as low temperature co-fired ceramic (LTCC), is fired at a lower temperature of about 900 to 1000° C. with gold, silver, copper, or silver-palladium based paste. In general, a ceramic powder and organic binder are mixed, extruded, and cut into malleable sheets. Since the sheets are easily worked, the vias are punched through the sheets and filled with the selected conductive paste. Conductor patterns are screen printed on one side. The sheet can be fired alone or in a stacked configuration under high temperature and pressure to form a sintered component.

However, the manufacture of multi-layer substrates using cast ceramic, or "green tape," introduces its own problems. This technology possesses a number of disadvantages due to potential variation in the alignment of conductive patterns, vias and cavities which limit interconnect density. These problems are created by the differential shrinkage within and between the individual layers of the ceramic material from which the multi-layer substrate is formed. Also, the surface roughness of the tape cast ceramics limit electrical performance. Further, since tape cast or green sheet ceramics can contain between 8% and 40% binders, the purity levels of the processed ceramics are not tightly controlled, leading to a compromise in electrical performance. In addition, the intrinsic shrinkage of the tape cast ceramic impacts the filling of vias such that voiding and/or other discontinuities become more challenging as the thickness of the substrate increases. See, e.g., Integrated Circuit Engineering Corporation, Ch. 11: Interconnect Substrate Technologies, pp 1130 to 1137, viewable at: www.smithsonianchips.si.edu/ice/cd/PKG_BK/CHAPT__11.PDF, the disclosure of which is incorporated by reference herein in its entirety.

If hardened ceramic substrates are employed, they can be drilled with a laser or other suitable method to form a plurality of vias. Molybdenum or tungsten ink can then be used to both print the wire patterns and fill the vias. However, this process may leave a significant number of electrically non-conductive "open" vias that render them unusable. See, e.g., U.S. Pat. No. 6,114,240, U.S. Pat. No. 6,215,321, and U.S. Pat. No. 6,852,627. Other via filling processes have also been described. U.S. Pat. No. 6,852,627, for example, describes the use of electroless plating processes to fill vias. Other patents, for example, U.S. Pat. No. 5,287,619 and U.S. Pat. No. 5,440,805, describe the use of electroplating processes to fill vias. The disclosures of the above six patents are herein incorporated by reference in their entireties.

Due to the above-described problems, via disks manufactured using co-fired technology have very low yields, often not exceeding 25%. These low yields result in long lead times, as well as increased costs.

SUMMARY OF THE INVENTION

In order to alleviate the disadvantages associated with the shrinkage that accompanies tape cast ceramic manufacture or the non-conductive "open" vias in hardened ceramics using molybdenum or tungsten inks, the use of hardened materials such as ceramics (e.g. alumina, aluminum nitride, etc.) or glass composites (e.g. Pyrex, etc.) are presented together with a method that fills vias with a minimum of voiding or other electrical discontinuity even as via length increases. Because hardened ceramics are rigid and stable, their ability to scale to larger size (wafer-scale) while maintaining dimensional control, good planarity, and surface finish, present significant benefits. Further, hardened ceramics can be obtained in higher purities than cast ceramics, providing for additional improvement in electrical performance. The invention uses a pressurized metal infiltration process to ensure each via is properly filled and avoids the shrinkage issues, open vias, low yields, and high costs associated with cofired and other conventional techniques.

In one aspect, the invention relates to a method of manufacturing a via disk, the method including the steps of providing a substrate comprising a substantially non-porous material having defined therethrough at least two vias, providing an electrically conductive material, and exposing at least one surface of the substrate to the electrically conductive material under conditions of elevated pressure and temperature, such that the electrically conductive material flows in a molten state to substantially fill the at least two vias, thereby forming at least two isolated regions of electrical conductivity through the substrate. In one embodiment of the above aspect, the substrate is alumina and the vias are formed by at least one of laser drilling, waterjet drilling, and mechanical drilling. In other embodiments, the substrate is PYREX. In another embodiment, the electrically conductive material can be aluminum, aluminum alloy, gold, silver, copper, or copper alloy. In still another embodiment, the method further includes the steps of placing the substrate in a mold and heating prior to pressurizing. In yet another embodiment, the mold is graphite.

In certain embodiments of the above aspect, the exposing step includes first heating the substrate and pressurizing the electrically conductive material. In another embodiment, the method further includes the step of removing electrically conductive material from a surface of the substrate between the at least two vias. In yet another embodiment, the removing step is selected from the group consisting of grinding, lapping, polishing, etching, and combinations thereof. In still another embodiment, the step of removing the electrically conductive material from the surface of the substrate leaves an exposed surface of conductive material within a via substantially coplanar with the surface of the substrate proximate the via.

In another embodiment, the method includes providing a bond pad electrically connected to at least one via. In another embodiment, the method includes the step of providing a layer of conductive metal interconnect on one side of the substrate in a predetermined pattern. Other aspects of the invention relate to a probe card having a via disk manufactured in accordance with the method of the above aspect, and/or a space transformer having a via disk manufactured in accordance with the method of the above aspect.

In another aspect, the invention relates to a via disk made of a substantially non-porous material and defining at least two vias therethrough, and an electrically conductive material disposed in each of the vias, wherein the electrically conductive material flows into the vias in a molten state under conditions of elevated pressure and temperature, such that the electrically conductive material substantially fills the at least two vias, thereby forming at least two isolated regions of electrical conductivity through the substrate. In an embodiment of the above aspect, the substrate is alumina and the vias are formed by at least one of laser drilling, waterjet drilling, and mechanical drilling. In other embodiments, the substrate is PYREX. In another embodiment, the electrically conductive material is selected from the group consisting of aluminum, aluminum alloy, gold, silver, copper, and copper alloy. In yet another embodiment, a surface of the substrate between the at least two vias is characterized by an absence of electrically conductive material. In still another embodiment of the above aspect, the exposed surfaces of the conductive material within the at least two vias are substantially coplanar with the surface of the substrate between the at least two vias.

In certain embodiments of the above aspect, the via disk has a nominal diameter of 100 mm, 150 mm, 200 mm, 300 mm, or 450 mm. In another embodiment, the via disk has a nominal thickness of about 0.5 mm to about 5 mm. In other embodiments, the via disk has a surface roughness of up to about 0.8 micrometers $R_a$. In still another embodiment, the two vias have a nominal diameter of up to about 0.25 mm. Still other embodiments include a length to diameter aspect ratio of up to about 1000:1. Another embodiment includes a plurality of electrically conductive vias, arranged in a symmetrical array with via-to-via spacing of up to about 5 mm. In another embodiment, the via disk includes a bond pad electrically connected to at least one via. In another embodiment, the via disk includes a layer of conductive metal interconnect disposed on one side of the substrate in a predetermined pattern. In another embodiment, the electrically conductive material disposed in at least one via exhibits an area of decreased conductivity proximate the substrate. Other aspects of the invention relate to a probe card including the via disk of the above aspect, and/or a space transformer including the via disk of the above aspect.

According to one embodiment of a commercial production method of the invention, a plurality of drilled substrates (e.g., alumina or aluminum nitride) are placed into a metal can in a stacked, interdisposed assembly with a corresponding number of graphite molds. Aluminum infiltration ingots are also added. The can is heated to a temperature of approximately 700° C. to melt the ingots. The can is then placed in a vessel and a partial vacuum is applied. Thereafter, the molten aluminum is pressurized at approximately 1,000 psi for 20 to 30 minutes to force the molten aluminum into the mold to fill the vias. The substrates are then cooled and removed from the can. They are separated from between the graphite molds and the flat surface faces are ground and polished to expose the filled vias. Thereafter, one or more layers of electrical wiring patterns are applied thereto, using adhesive, seed layers, routing layers, etc. (e.g., conductive copper or other metal-filled inks to electrically connect specific vias). Bond pads can be attached to the reverse side. Thick or thin film deposition could alternatively be employed. Finally, conductive pins are added, so that the probe card can make electrical contact with the test system and the circuit contact pads on the wafer.

BRIEF DESCRIPTION OF THE DRAWINGS

Other features and advantages of the present invention, as well as the invention itself, will be more fully understood from the following description of the various embodiments, when read together with the accompanying drawings, in which.

DETAILED DESCRIPTION

Figure 1:
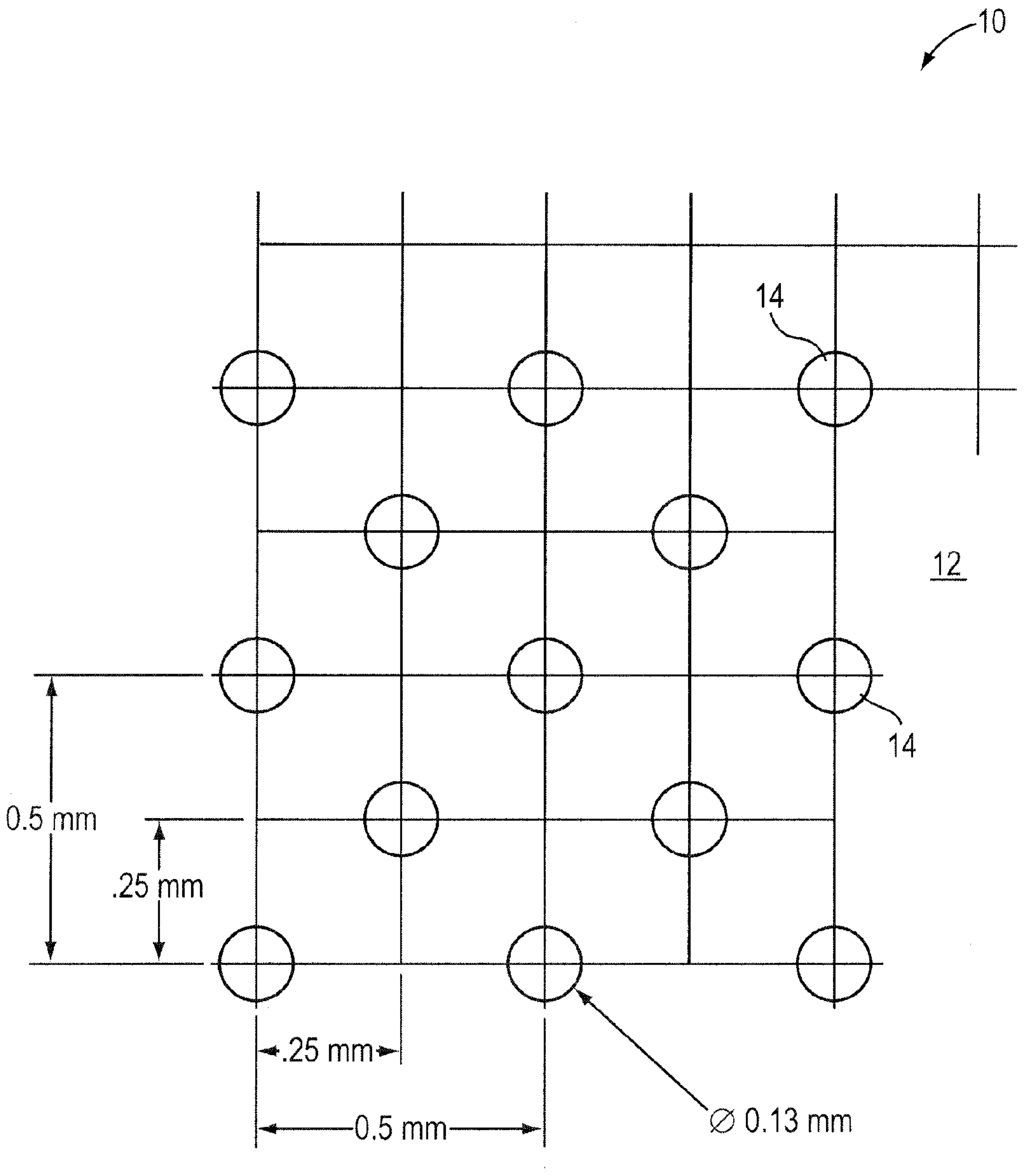
FIG. 1 is a schematic top view of a pitch pattern for a via disk in accordance with an embodiment of the present invention.

Certain processes for infiltrating porous substances with a conductive material are described in U.S. Pat. Nos. 5,111,870 and 5,111,871, both to Cook, the disclosures of which are hereby incorporated by reference herein in their entireties. Additionally, U.S. Pat. No. 5,322,109 to Comic and U.S. Pat. No. 6,148,899 to Comic et al., the disclosures of which are hereby incorporated by reference herein in their entireties, generally describe evacuating a mold cavity and pre-heating both the mold and infiltrant. These patents describe articles that are completely filled with infiltrant. Such fully-infiltrated articles would be unsuitable for use in semiconductor device and probe card applications, which require conductive elements at discrete locations through a substrate.

A process for manufacturing a substrate according to the invention, such as an aluminum-filled via disk ("AVD"), begins with a disk or substrate of non-conductive, non-porous, ceramic material. In one embodiment, the disks may be manufactured by Morgan Ceramics from Deranox 995 material, which is 99.5% pure alumina. Other disks manufactured from alternative materials may also be utilized, such as disks of about 96% to about 99.6% pure alumina, disks of aluminum nitride, or non-ceramic disks. Non-ceramic substrates may also be used, such as glass or material manufactured under the brand name PYREX. Other desirable substrate materials may include insulating materials with a coefficient of thermal expansion (CTE) similar to silicon and a melting temperature (or in the case of glasses, a glass transition temperature $T_g$) higher than the infusion temperature, so that the substrate does not deform during the infusion process. Additionally, substrates need not be formed as disks. Rectangular, oval, and other shapes are contemplated.

Various ceramic substrates may be utilized in the process including disks having nominal diameters of 100 mm, 150 mm, 200 mm, 300 mm, and 450 mm. Some examples of commercially desirable disks include Ø 300 mm+0.25/−0 with a thickness of 1 mm±0.076; Ø 100 mm+0.25/−0 with a thickness of 1 mm 0.076; and Ø 150 mm+0.25/−0 with a thickness of 1.5 mm±0.076. Other sizes, substrate shapes and dimensions are also contemplated. For example, notwithstanding disk diameter, thicknesses of about 0.5 mm to about 5.0 mm may be utilized in the present invention. Larger thickness disks may more easily maintain planarity during the infiltration process and also may be polished (as described below) under less strict tolerances, due to the overall thickness of the substrate. Disks may also have larger or smaller diameters than those indicated above, for example, disks of Ø 50 mm and smaller, and disks of Ø 450 mm and larger may also be used. The disks may have an initial surface roughness tolerance of up to about 0.8 micrometers $R_a$ average roughness or greater, prior to infiltration and polishing.

The ceramic disks may be obtained from a source with one or more vias already formed therethrough, or drilling the disks may be the first step in the process. Techniques for laser, water jet, mechanical, or other drilling in ceramic are known. For example, a $CO_2$ laser may be used to drill holes on a square 1 mm pitch pattern. The laser drilling process may produce vias having substantially cylindrical dimensions, though typically the holes will have a slight taper narrowing from the entrance toward the exit hole. Vias having a nominal diameter of approximately 0.25 mm may be utilized. In general, there is no limitation to the dimensions of the vias that may be filled by the infiltration process described herein. Particularly desirable via diameters may be in a range from about 0.1 mm to about 0.15 mm. Vias having diameters in a range of up to about 0.25 mm or up to about 0.76 mm may be desirable for particular applications. Additionally, length-to-diameter aspect ratios of up to about 4:1, up to about 10:1, up to about 20:1 and up to about 1000:1 may provide particular advantages for some applications. In a particular embodiment, a via of about 0.13 mm in diameter through a 1 mm thick substrate, thus having an aspect ratio of about 8:1, may be completely filled by using the method of the invention. Other via disk embodiments include about 0.2 mm diameter vias through a substrate of about 5 mm thick, thus having an aspect ratio of 25:1. It is anticipated that the present invention will effectively fill vias in ceramic substrates up to about 10 mm thick and smaller diameter holes down to about 0.01 mm for aspect ratios of 1000:1.

In one embodiment of a disk having tapered vias, the entrance of each via is approximately 0.16 mm in diameter and the exit of each via is approximately 0.12 mm in diameter. Other via shapes are also contemplated, including vias having hourglass-shaped cross sections, and vias having non-circular peripheries. Hourglass shaped cross-sections may help prevent pull-out of the filled vias after infiltration. Regardless of whether the vias are tapered, cylindrical, or otherwise shaped, after drilling, the disks may be bead-blasted to remove any slag, and may also be ultrasonically cleaned in Citrisol solution for approximately 15 minutes to remove any remaining debris in the vias. Citrisol is manufactured by Morning Star Industries of Jensen Beach, Fla.

In addition to laser drilling, vias could be punched or machined in green state ceramic and then fired, or they could be machined or water jet-cut into fired ceramic. Excimer laser tools that can drill holes smaller than 100 μm (e.g., as small as about 20 μm to 30 μm) in 1.5 mm thick substrates may also be utilized. Care should be taken when drilling vias with lasers, to ensure complete vias through the substrate material. Very small diameter vias may be drilled from both the front and the back of the substrate. In such a case, a via is drilled to a depth of approximately one-half of the substrate thickness. The substrate is then turned over and another hole is drilled at the exact same coordinates on the other side. Mechanical alignment tolerances are typically better that about +/−2.5 μm and possible as low as about +/−0.5 μm. Thicker substrates may also benefit from this drilling procedure. With these tolerances, misalignment does not significantly increase the hole size. Mechanical drilling can be used for larger (e.g., greater than 300-500 μm) diameter holes. Additionally, the pitch (i.e., the distance between the vias) may also vary, depending on the application or design requirements. For example, a pattern of vias configured as a symmetrical square array having about 0.5 mm pitch (i.e., via-to-via spacing) may be useful for certain applications.

A representative via arrangement is depicted in FIG. 1, which depicts a substrate 10 having a substrate surface 12 and a plurality of vias 14 therethrough. In this embodiment, Ø 0.13 mm vias are arranged in a staggered symmetrical square array, wherein each adjacent row of vias is offset. The depicted arrangement has a 0.25 mm pitch between adjacent rows, and a 0.5 mm pitch between non-adjacent rows. Other custom pitches and via diameters are also contemplated, as are nonuniform patterns, repetitive patterns, and patterns other than rectangular arrays (e.g., nested circular bullseye patterns).

Figure 2:
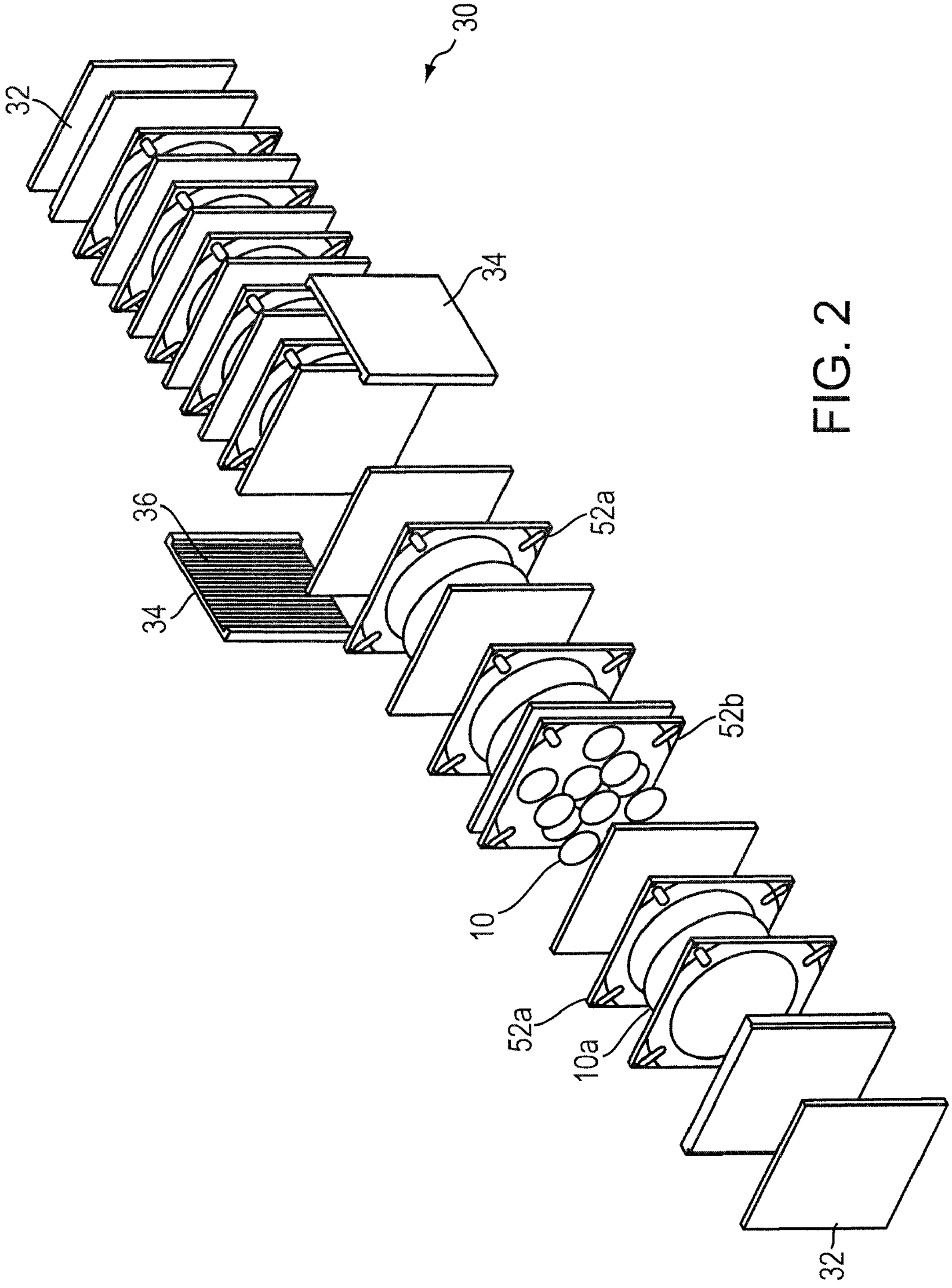
FIG. 2 is an exploded schematic perspective view of a mold assembly in accordance with an embodiment of the present invention.
Figure 3:
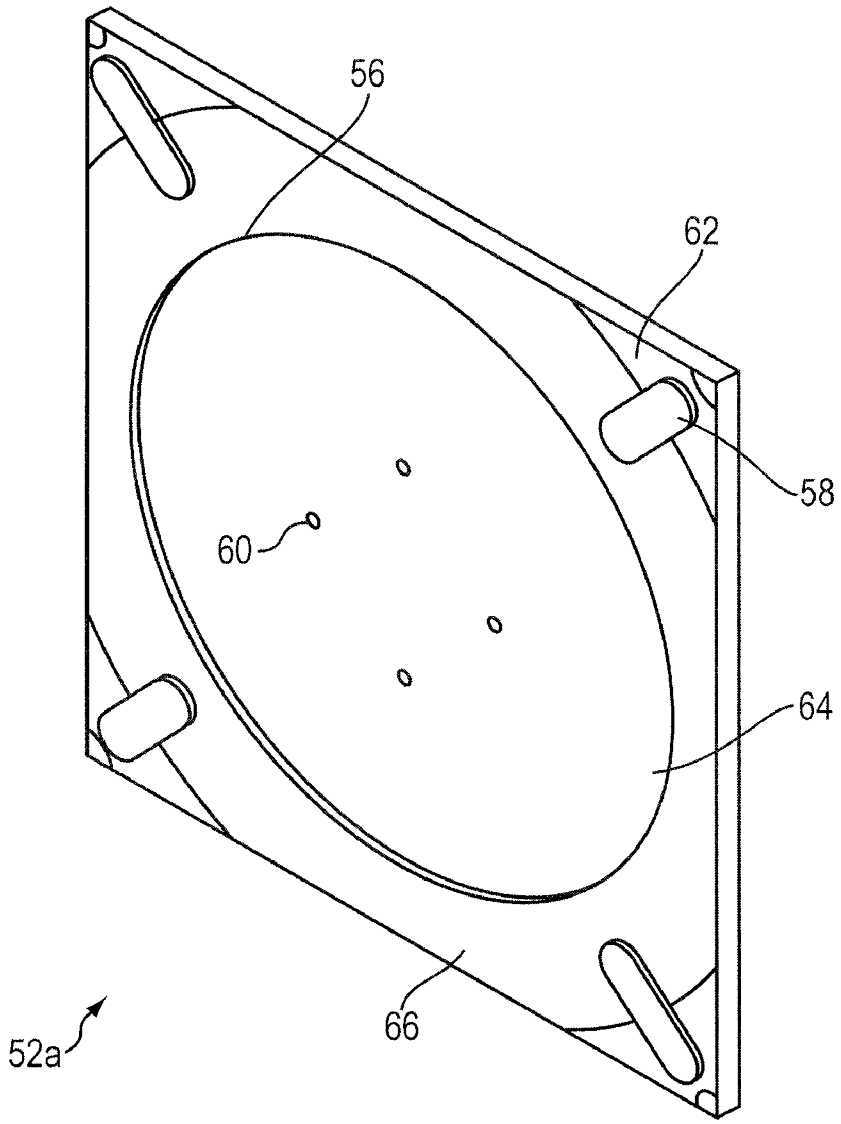
FIG. 3 is a schematic perspective view of a graphite mold in accordance with an embodiment of the present invention.

Once the vias are formed in the ceramic disks, the disks are loaded into a graphite mold for the infiltration process. An exploded view of such a mold 30 is presented in FIG. 2. The mold includes end plates 32, as well as side clamp plates 34. The side clamp plates 34 include a plurality of flow channels 36 to aid in distribution of the infiltrant during the manufacturing process. The mold plates 52 may be square plates of Barlo B-325 graphite with circular recesses to hold the disks 10, as depicted in more detail in FIG. 3. Both single disk mold plates **52*a* and multi-disk mold plates 52*b* may be utilized. FIG. 3 depicts an enlarged view of a mold plate 52*a* sized to receive a single disk 10***a*. Regardless of the disk capacity, the mold plates 52 generally include a housing 66 and are sized to hold the disks 10 in place around the outer edges with a retaining ring 56 held in place by a locking element 58 and, in the case of larger disks (e.g., about 300 mm and larger), are supported by pedestals 60 at or near the middle of the disks 10. The mold plates 52 also may include mating surfaces 62 to mate with adjacent mold plates. The mold plates 52 are spaced from the disks to provide a cavity 64 into which molten aluminum can flow to fill any shrink voids and allow for proper filling of the vias.

Figure 4:
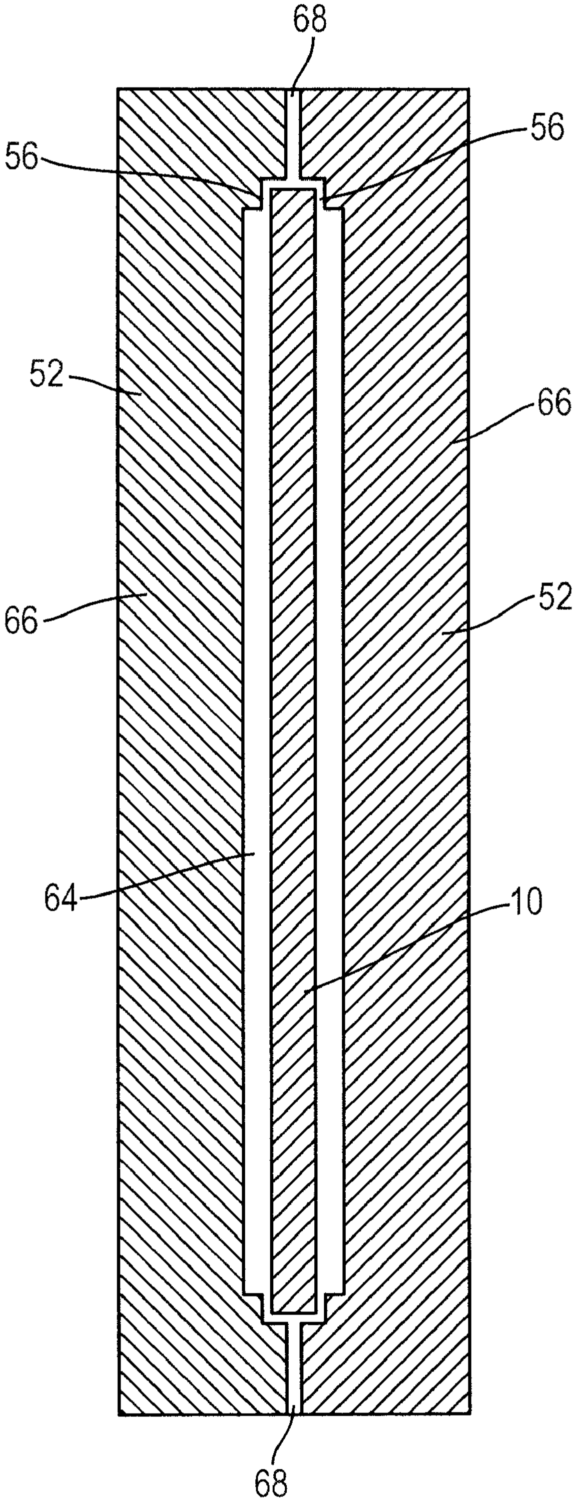
FIG. 4 is a partial schematic cross-sectional view of the graphite mold assembly of FIG. 3.
Figure 5:
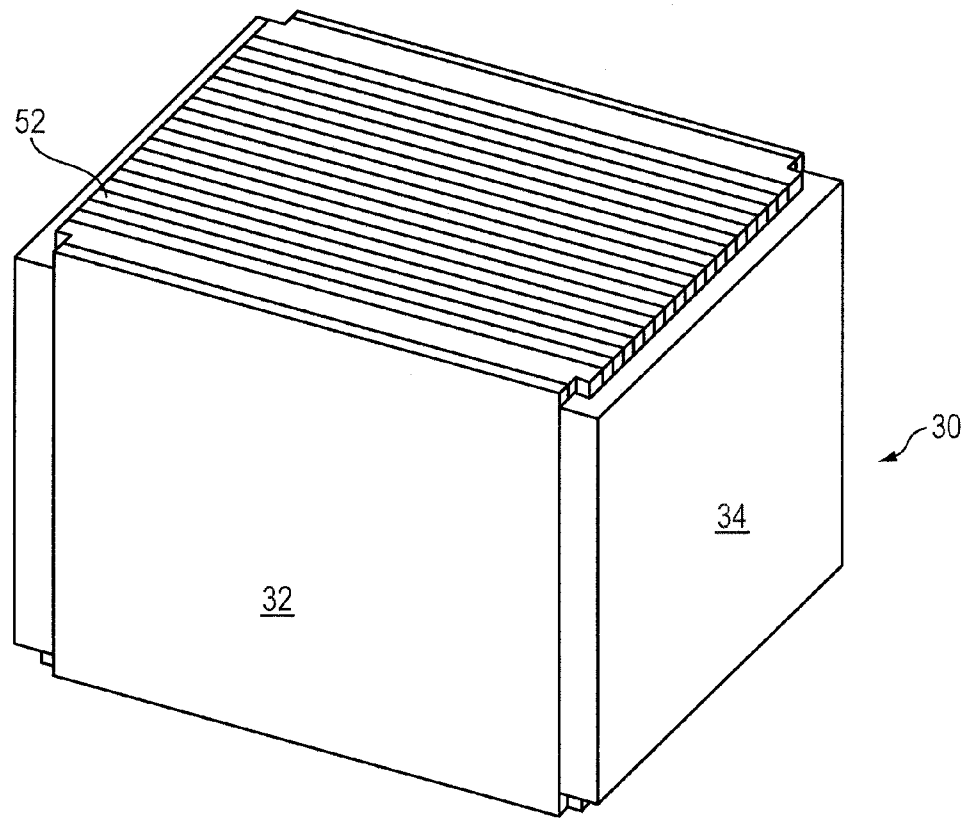
FIG. 5 is a schematic perspective view of the mold assembly of FIG. 2.

One pair of mold plates 52 and the resulting cavities 64 are depicted in FIG. 4. The mold plate housing 66 may provide approximately 0.18 mm of clearance between the mold plate 52 and the disk 10 face on each side, but other clearances are contemplated. One or more inlets 68 allow for the introduction of infiltrant during processing. A release agent, such as DAG137 or Propag, both made by Acheson Colloids Co. of Port Huron, Mich., may also be applied to the surfaces of the graphite mold. In one configuration, ceramic disks are sandwiched between the pairs of mold plates and are assembled using graphite clamps to form a mold assembly. An assembled view of the mold assembly of FIG. 2 is depicted in FIG. 5.

Figures 6A, 6B, 6C, 6D:
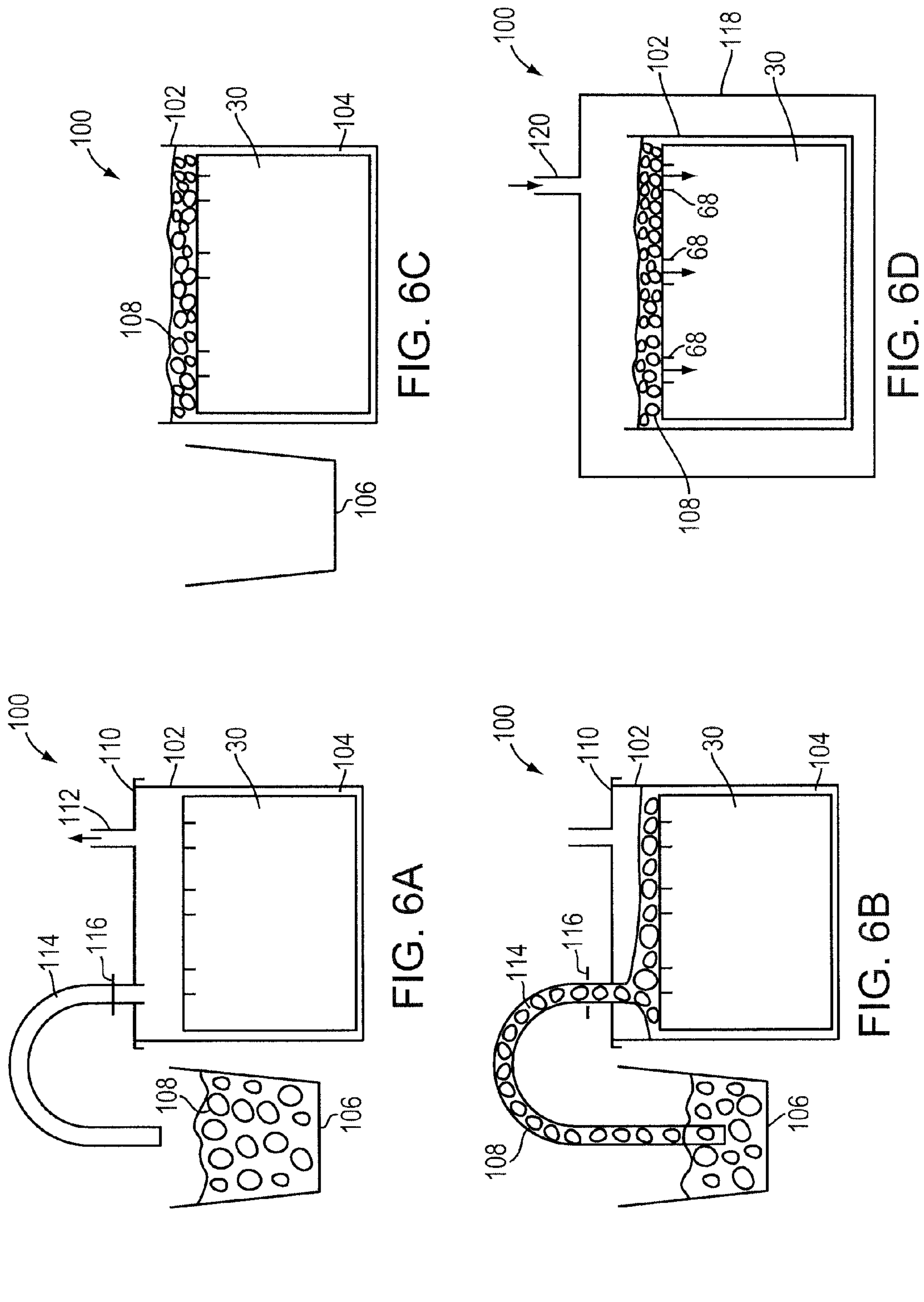
FIGS. 6A-6D are schematic views of a manufacturing process in accordance with one embodiment of the present invention.

One process of infiltrating the mold assembly with infiltrant, as well as the infiltrant system 100 itself, is depicted in FIGS. 6A-6D. The graphite mold assembly 30 is placed in a steel box or can 102, which is sized to minimize the space 104 around the mold assembly 30. The mold assembly 30 and the can 102 are then pre-heated to the infiltration temperature (i.e., the temperature at which the conductive material liquefies). Separately, ingots of infiltrant are heated in a crucible 106 until they reach a molten state 108. The can 102 is sealed with a seal 110, and a partial vacuum environment is created therein, via the removal of air via an air passage 112. A fill tube 114 is then placed into the molten infiltrant 108 and a gate valve 116 thereon is opened. Alternatively, a melt cap can be provided at the opening of the fill tube. The vacuum within the sealed can 102 quickly draws the infiltrant 108 into the can 102 where it spreads across the top of the mold assembly 50, as depicted in FIG. 6B. Once a sufficient amount of molten infiltrant 108 has been drawn into the can 102, the seal can be removed (as depicted in FIG. 6C) and the can 102, mold assembly 30, and molten infiltrant 108 are placed within an autoclave 118 (as depicted in FIG. 6D). Thereafter, the autoclave 118 is pressurized via a pressurization inlet 120 to a range from about 850 psi to about 1000 psi to ensure complete filling of the vias. Infiltration occurs as the molten infiltrant 108 is forced into the mold assembly 30, via the inlets 68. A related process is described in more detail in U.S. Pat. No. 6,148,899, the disclosure of which is hereby incorporated by reference herein in its entirety.

In one embodiment, using A356.2 aluminum alloy as the conductive material, the alloy is injected into the top of the mold at a pressure of about 1000 psi and a temperature of approximately 700° C. Alternatively, molten 413.0-F aluminum alloy may be utilized. In other embodiments, other conductive materials, such as aluminum, copper, gold, silver, copper alloy, or other metals or alloys, may be utilized in place of the aluminum alloys. If copper is used, the mold assembly can be pre-heated to approximately 1200° C. An alternative process includes first placing the infiltration material ingots in the can, on top of the mold, prior to heating the ingots and can. After the ingots obtain a molten state and the can is sufficiently heated, the can, mold assembly, and molten infiltrant are placed in the autoclave and the pressurization process is performed. Other temperatures and infiltration temperatures may be utilized with satisfactory results. For example, A356.2 aluminum alloy may be injected into the mold at pressures from about 850 psi to about 1500 psi. In other embodiments, infiltration pressures range from about 1000 psi to about 1400 psi, and from about 1100 psi to about 1300 psi. Also contemplated are infiltration temperatures of about 700° C. to about 800° C., of about 725° C. to about 775° C., and of about 740° C. to about 760° C., for A356.2 aluminum alloy. Infiltration temperatures and pressures should be sufficient to help ensure melting of the infiltrant and filling of vias, without damage to the disks, which may occur with overpressurization. Infiltration temperatures may differ, depending on the particular infiltrant used.

As the molten conductive material migrates through the mold assembly 30, the surfaces of the disks 10 are exposed to the molten material 108, in the clearances between the disks 10 and the graphite mold plates 52. Thus, the vias are filled from both sides of the disk 10. Alternative embodiments of the mold assembly may introduce the molten conductive material from solely one side of the disk. Due to pressurization of the molten material, extremely high infiltration rates may be achieved. Additionally, due to the pressurization, the process of infiltration is extremely fast, and via openings, regardless of aspect ratio, may be completely or substantially completely filled with infiltrant. Generally, factors that may limit the amount of infiltration include debris remaining within the vias, insufficient temperature to cause phase change of the metal from a solid state to a molten state, or insufficient pressurization of the molten material within the mold assembly. In certain embodiments, the infiltration process takes approximately one hour. Other infiltration times are contemplated, for example about 20 minutes to about four hours, about 30 minutes to about three hours, and from about one hour to about two hours. After infiltration at an elevated temperature, the temperature is decreased and the infiltrant begins to solidify. Once the temperature drops below the solidification temperature, the mold is removed from the autoclave and allowed to cool slowly, in certain embodiments, up to 24 hours prior to de-molding. Cooling times may vary from about 8 hours to over 24 hours, from about 10 hours to about 22 hours, from about 12 hours to about 20 hours, and from about 14 hours to about 18 hours. Cooling times may also be reduced by using a active chilling element or system. Increased infiltration times and cooling times may not be desirable, as total manufacturing time would be increased, but may help ensure complete filling of vias.

A reservoir of molten aluminum may be maintained on top of the mold assembly 50 to back fill any volume lost due to shrinkage during the cooling process. In other embodiments, the mold may be cooled under elevated pressure such as at the injection pressure of 1000 psi. Other pressures during cooling are also contemplated. Infiltration time and cooling time may, of course, vary depending on the size of the disks, number of disks within the can, conductive material utilized, etc. Once sufficiently cooled, the infiltrated disks are pried from the mold assembly. The graphite molds, if undamaged, may be re-used. The infiltration process may be performed by Metal Matrix Cast Composites of Waltham, Mass.

After infiltration, excess aluminum can be removed from the surfaces of the disks to finish the disk and leave the aluminum-filled vias exposed. Generally, the amount of excess aluminum should be consistent with the depth of the cavity between the disk and the adjacent graphite mold. This excess aluminum can be removed by one or more of grinding, lapping, polishing, and etching processes. In one exemplary process, the bulk of the excess material may be removed using a grinding wheel during a Blanchard grinding process. The disks then may be lapped, for example, using a single-sided lap with an oil-based slurry. The final polishing step is used to achieve material finish requirements, and may utilize a slurry of de-ionized water and colloidal silica. At any point during the finishing process, the parts may be inspected for cracks, as a result of mechanical or thermal stress. Surface roughness after excess material removal processes may be up to about 0.9 μm $R_a$. In other embodiments, surface roughness in excess of 0.9 μm $R_a$ are also contemplated. Lapping may provide a nominal 0.8 μm $R_a$ surface roughness and certain polishing techniques may achieve very low surface roughness (about 0.05 μm $R_a$ in some cases) with particular polishing techniques.

At the completion of excess material removal processes, the filled vias are exposed and form isolated regions of electrical conductivity through the disk. Generally, the excess material removal processes expose the surface of a filled via to a level substantially coplanar with the substrate proximate the via. Since the areas of the disk between the filled vias comprise only non-conductive ceramic, the filled vias form regions of conductivity discrete from adjacent vias. The method of making the AVDs described herein greatly decreases manufacturing time and increases yield, up to about 95%, versus the yields obtained from the standard cast method.

Figure 7:
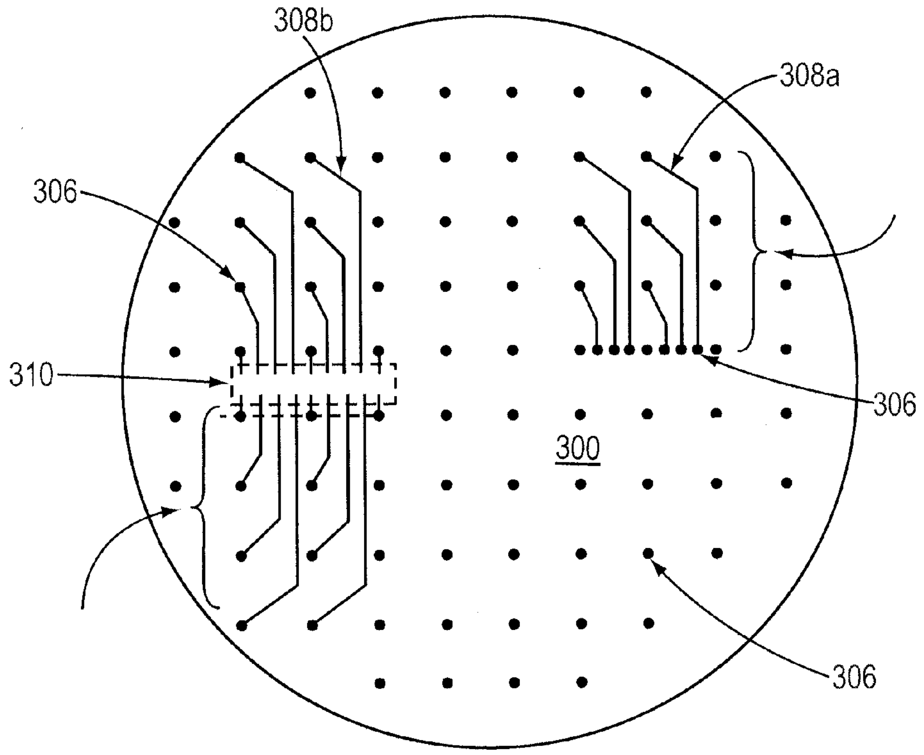
FIG. 7 is a partial schematic top view of a portion of a via disk manufactured in accordance with an embodiment of the present invention having interconnects thereon.
Figure 8:
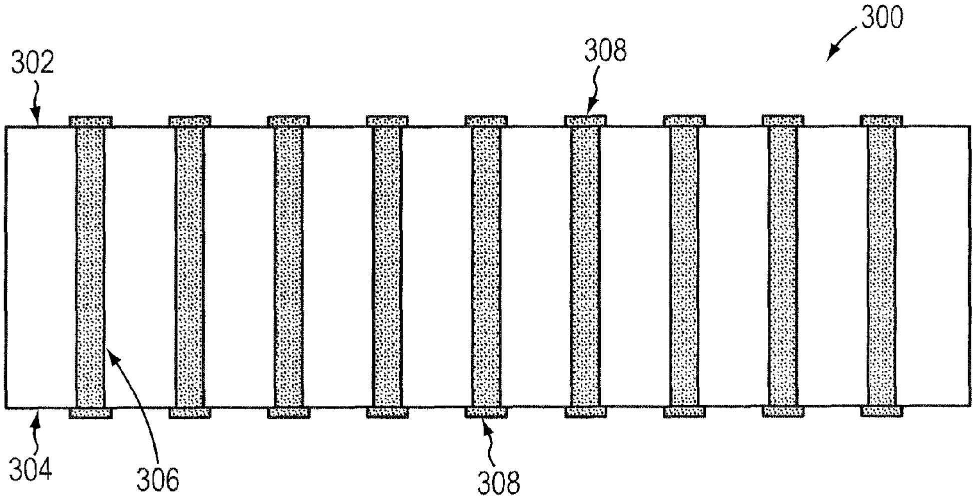
FIG. 8 is a partial schematic cross-sectional view of the via disk of FIG. 7.

FIG. 7 depicts a portion of a via disk manufactured in accordance with the present invention, having interconnects thereon. FIG. 8 depicts a representative section through the via disk of FIG. 7. The via disk 300 has a top surface 302 and a bottom surface 304. The disk 300 is penetrated by a plurality of vias 306 extending between the top surface 302 and the bottom surface 304. An electrically conductive pad 308 or trace may be placed on the terminal surfaces of the vias 306. One or more electrically conductive interconnects 308 (made of, for example, aluminum, copper or other conductive material) may be present on the top surface 302 or the bottom surface 304. One or more adhesion layers, seed layers, and other layers (not shown) known in the art, may also be included as required or desired prior to mounting the conductive interconnects. In one embodiment, the wiring patterns are created using standard semiconductor manufacturing technologies such as photolithography to define the patterns, and electroplating to fill the openings with conductive material. Alternatively, physical vapor deposition may be utilized to deposit the conductive material and photolithography and wet chemical or plasma etching may be used to pattern the conductive material.

These interconnects 308 may connect one via to a second via (as depicted by 308*a*) or from one via to another electrically conductive interconnect material such as a test probe 310 that would contact the pad 308 (as depicted by 308*b*). The via disk 300 may also contain filled vias 306 that do not have contact pads if the connection is not utilized. Known interconnect routing process, such as fan-in and fan-out routing, may be utilized on the via disks manufactured in accordance with the present invention. Electrical interconnects may also be routed directly on the substrate or utilizing thin- or thick-film techniques. The finished AVDs may then be assembled, by known processes, into space transformers and probe cards.

EXAMPLE

A Ø 100 mm AVD was manufactured in accordance with the teachings herein, specifically, a drilled ceramic disk was placed in a mold and heated to about 700° C. and pressurized with A356.2 aluminum alloy infiltrant to a pressure of about 1000 psi for approximately 30 minutes. The mold was then allowed to cool at ambient pressure until it reached ambient temperature. After processing to remove excess material, various tests were performed to determine performance characteristics of the AVD. The results of these tests are presented below.

Since the via forms part of the signal path, it is generally desirable that the via displays a low resistance value. To test resistance of the filled vias, five vias were chosen for measurement at various locations on the prepared sample. Resistance was measured at both 1 and 5 volts. The results are depicted in Table 1, below.

TABLE 1

Via Resistance Test Results

| Test Point No. | Source Set Volt | Source Current | Meter milliVolts | Results $\Omega \times 10^{-3}$ |
|---|---|---|---|---|
| 1 | 5 | 0.1 | 0.125 | 1.250 |
| | 1 | 0.1 | 0.125 | 1.250 |
| 2 | 5 | 0.1 | 0.113 | 1.130 |
| | 1 | 0.1 | 0.113 | 1.130 |
| 3 | 5 | 0.1 | 0.103 | 1.030 |
| | 1 | 0.1 | 0.110 | 1.100 |
| 4 | 5 | 0.1 | 0.118 | 1.180 |
| | 1 | 0.1 | 0.117 | 1.170 |
| 5 | 5 | 0.1 | 0.115 | 1.150 |
| | 1 | 0.1 | 0.115 | 1.150 |

Through-via electrical resistance measured no greater than 1.25 mohm, which is good for this application. The resistivity of the tested aluminum vias are approximately one-tenth that of a similar tungsten via.

Isolation resistance between adjacent aluminum vias was also measured. This data is important because different electrical signals will pass through different vias. Accordingly, those vias must be electrically isolated from each other. Poor isolation may create noise on the data lines or may cause signals to be shorted out. Tests were performed on a number of vias as described below. The first five via locations chosen for isolation leakage measurement were spread across the substrate sample. The sixth via location was chosen because a small amount of aluminum smearing could be seen with a microscope. This smearing may be an indication of the polishing processes redistributing the soft aluminum material from the vias to neighboring ceramic surface area. This can be prevented by optimizing the processes or implementing a post-polishing clean that etches a small amount of aluminum.

TABLE 2

Via-to-via Isolation Test Results, Part 1

| Test Point No. | Source Set Volt | Meter Amps $\times 10^{-10}$ |
|---|---|---|
| 1 | 100 | 1.700 |
| 2 | 100 | 1.720 |
| 3 | 100 | 1.680 |
| 4 | 100 | 1.720 |
| 5 | 100 | 1.720 |
| 6 | 100 | 1.500 |

Insulation resistance was also measured on a second portion of the AVD. In this case, three via locations were chosen spread across the sample piece and leakage current between the center via and the eight adjacent vias was measured. The results are in Table 3 below.

TABLE 3

Via-to-via Isolation Test Results, Part 2

| Test Point No. | Source Set Volt | Meter Amps $\times 10^{-10}$ |
|---|---|---|
| 1A | 100 | 1.903 |
| 1B | 100 | 1.915 |
| 1C | 100 | 1.896 |
| 1D | 100 | 1.980 |
| 1E | 100 | 1.920 |

TABLE 3-continued

| Via-to-via Isolation Test Results, Part 2 | | |
|---|---|---|
| Test Point No. | Source Set Volt | Meter Amps × $10^{-10}$ |
| 1F | 100 | 1.947 |
| 1G | 100 | 1.976 |
| 1H | 100 | 1.967 |
| 2A | 100 | 1.977 |
| 2B | 100 | 1.975 |
| 2C | 100 | 1.973 |
| 2D | 100 | 1.966 |
| 2E | 100 | 1.960 |
| 2F | 100 | 1.970 |
| 2G | 100 | 1.961 |
| 2H | 100 | 1.966 |
| 3A | 100 | 1.960 |
| 3B | 100 | 1.962 |
| 3C | 100 | 1.954 |
| 3D | 100 | 1.960 |
| 3E | 100 | 1.963 |
| 3F | 100 | 1.953 |
| 3G | 100 | 1.964 |
| 3H | 100 | 1.954 |

As can be seen from the two tables, via-to-via isolation resistances are in giga-ohms values, which are extremely high readings, indicating excellent electrical isolation between adjacent vias. Additional measurements between all vias could be performed to ensure sufficient isolation for an entire AVD. Such testing would likely entail the use of automated equipment.

Surface roughness is also a consideration. In subsequent steps of the AVD manufacturing process, bond pads and interconnects may be present on one or both sides of the disk. A rough disk surface increases the difficulty to control the dimensions of the interconnects and the pads. An optimized polishing process allows the disks to achieve the desired roughness. Surface roughness was measured in two separate locations near the center of the sample, and are consistent with lapped and polished alumina with $R_a$ values at 0.11 μm (4.4 μin) and 0.15 μm (6 μin). While these numbers are reflective more of the polishing processes and less of the infiltration process, they do demonstrate that the AVD made in accordance with the present invention may be polished to a roughness comparable to prior art disks.

After polishing, testing was also performed to ensure that the top exposed surface of the via was substantially even with the top surface of the substrate. A profilometer was used to test the recessed depth of the aluminum plug below the ceramic surface after polishing. The tool uses a diamond tip moved over the substrate, recording vertical displacement as the tip contacts the substrate, then the via. The larger the recess, or "step," the greater the difference between the surface of the substrate and the surface of the via. A higher step may adversely affect the ability to lay a continuous metal trace on the ceramic surface with the vias. If the step is too high, for example, greater than about 5-10 μm, the metal trace on the ceramic could be disconnected from the recessed via. One such test is included below.

TABLE 4

| Vias measured for roughness and cross section dimensions | | | | |
|---|---|---|---|---|
| | Top of via width (μm) | Metal width (μm) | Metal depth (drop in (μm) | Ra (μm) of the metal |
| Side A | 170 | 150 | 1.5 | 350 |
| | 180 | 180 | 1.3 | 425 |
| | 198 | 180 | 1.5 | 355 |

TABLE 4-continued

| Vias measured for roughness and cross section dimensions | | | | |
|---|---|---|---|---|
| | Top of via width (μm) | Metal width (μm) | Metal depth (drop in (μm) | Ra (μm) of the metal |
| Side 13 | 174 | 152 | 1.5 | 260 |
| | 178 | 150 | 1.5 | 265 |
| | 158 | 130 | 1.2 | 235 |

Surface flatness and parallelism (i.e., relative variation between the top and bottom planes of the substrate) are important for probe card applications. During preparation of the probe card, the pins are arranged so as to contact the wafer with semiconductor devices during testing. However, these pins have limited compliance in the z axis. Poor flatness and parallelism may prevent all pins from contacting all the intended pads of the semiconductor devices, which would adversely effect proper operation.

Flatness was measured both across two perpendicular dimensions of the disk. The measurements were 80.11 μm/68 mm (1.18 mil/inch) and 11.47 μm/36 mm (0.32 mil/inch). For probe card manufacture, about 1-2 mil of flatness is generally desirable, because the compliance of the pins in the z-direction is typically limited to a few mils. Flatness is also desirable to ensure contact with the bond pads.

For this sample, parallelism was measured at 1.35 mils. This measurement is based upon providing a window (upper and lower parallel plates) that the substrate must stay within. The results of the parallelism measurement are in Table 5 below.

TABLE 5

| Substrate parallelism | |
|---|---|
| Test Corner No. | Indicator Inches × $10^{-3}$ |
| Corner 1 | 19.450 |
| Corner 2 | 19.250 |
| Center 3 | 20.600 |
| Corner 4 | 19.800 |
| Corner 5 | 19.950 |
| Parallelism | 1.35 |

When the probe tip is positioned within about 25 μm from the edge of a filled metal via, the resistance reading fails (about 1 ohm to a full open contact). If the probe is then centered on the via and retested, the reading drops back to a low resistance reading, indicating that there is a high resistivity annulus close to the edge of the hole, at the metal/ceramic interface. It has been determined that this high resistivity annulus is caused by a metal bonding reaction between the molten metal and the ceramic disk. It is understood that the molten aluminum reacts with the alumina substrate, forming an aluminum oxide compound. This aluminum oxide compound is removed from the surface of the disk during the grinding, lapping and polishing process, but remains as an annular layer between the alumina substrate and the aluminum via. This bonding reaction is desirable, since it increases the retention strength of the metal via within the ceramic disk, reducing the likelihood of metal pull-out during surface layer metal removal. Further, without this reaction layer, the coefficient of thermal expansion mismatch between the alumina and aluminum could cause the aluminum plug to fall out of the substrate upon cooling, due to the higher shrinkage of the aluminum versus the alumina substrate.

The high resistivity annulus does not appear to have an adverse effect on conductivity of the vias, since the annulus represents only a small area of the total via area, about 25 μm thick. In very small diameter vias, it is theoretically possible that the non-conductive or less conductive layer may extend through the entire diameter of the via. It appears, however, that the limitations of laser drilling are the most common limitation imposed upon the size of the vias; limitations due to formation of a non-conductive annulus are not expected to cause significant issues in commercial applications for these disks, given achievable via diameters and pitch patterns. It is expected that the composition of the non-conductive annulus may vary from a very low oxygen content next to the aluminum to stoichiometric alumina next to the alumina substrate. In the case of very small spaces between vias, i.e. 25 μm or less, it is theoretically possible that this high resistivity annulus may compromise the electrical isolation between adjacent vias. It is not expected to cause significant issues in commercial applications for these disk, given achievable/desirable via diameters and pitch patterns.

During the manufacturing process, the disks may be subject to warpage and, under certain circumstances, actual cracking may occur due to extreme warpage. Two theories exist as to why the disks are subject to warpage and cracking. First, warpage and cracking may be the result of differences in the thickness of the solidified aluminum on either side of the AVD disk. As the molten aluminum spreads around the disk and infiltrates the vias, more aluminum may be present on a single side of the disk. As the aluminum cools, the difference in thicknesses may cause warpage or even cracking of the disk. The second theory considers the initial roughness of the disks, prior to infiltration. Since few surfaces are entirely smooth (at a microscopic level), it is possible that aluminum infiltrates microscopic cracks in the surface of the disks while the disk is subject to infiltration under vacuum. During subsequent pressurization and hardening of the aluminum, the aluminum that has penetrated surface cracks exerts pressure upon those cracks, causing distorting forces (or, in extreme cases, cracks) in the disks. To address these potential problems, mold designs may be improved to minimize and equalize the interstitial spaces on either side of the disks. A second approach is to increase the total infiltration time to ensure that the liquid aluminum has fully penetrated both sides of the mold, prior to pressurization.

While there have been described herein what are to be considered exemplary and preferred embodiments of the present invention, other modifications of the invention will become apparent to those skilled in the art from the teachings herein. The particular methods of manufacture and geometries disclosed herein are exemplary in nature and are not to be considered limiting. It is therefore desired to be secured in the appended claims all such modifications as fall within the spirit and scope of the invention. Accordingly, what is desired to be secured by Letters Patent is the invention as defined and differentiated in the following claims.

What is claimed is:

1. A method of manufacturing a via disk, the method comprising the steps of:

providing a substrate comprising a non-porous material having defined therethrough at least two open vias, each of the vias extending from a first side of the substrate to a second side of the substrate, and having a first opening at the first side of the substrate and a second opening at the second side of the substrate;

providing an electrically conductive material;

melting the electrically conductive material; and subsequently, exposing at least one surface of the substrate to the molten electrically conductive material under conditions of elevated pressure and temperature, such that the electrically conductive material flows into the at least two open vias in a molten state free of solid state material to fill the at least two open vias, thereby forming at least two isolated regions of electrical conductivity through the substrate.

2. The method of claim 1, wherein the substrate comprises alumina and the vias are formed by at least one of laser drilling, waterjet drilling, and mechanical drilling.

3. The method of claim 1, wherein the substrate comprises glass.

4. The method of claim 1, wherein the electrically conductive material is selected from the group consisting of aluminum, aluminum alloy, gold, silver, copper, and copper alloy.

5. The method of claim 1, further comprising the step of placing the substrate and the electrically conductive material in a mold prior to heating and pressurizing.

6. The method of claim 5, wherein the mold comprises graphite.

7. The method of claim 1, wherein the exposing step comprises first heating and then pressurizing the electrically conductive material.

8. The method of claim 1, further comprising the step of removing electrically conductive material from a surface of the substrate between the at least two vias.

9. The method of claim 8, wherein the removing step is selected from the group consisting of grinding, lapping, polishing, etching, and combinations thereof.

10. The method of claim 8, wherein the step of removing the electrically conductive material from the surface of the substrate leaves an exposed surface of conductive material within a via substantially coplanar with the surface of the substrate proximate the via.

11. The method of claim 8, further comprising the step of providing a bond pad electrically connected to at least one via.

12. The method of claim 8, further comprising the step of providing a layer of conductive metal interconnect on one side of the substrate in a predetermined pattern.

13. A probe card comprising a via disk manufactured in accordance with the method of claim 1.

14. A space transformer comprising a via disk manufactured in accordance with the method of claim 1.

15. A via disk comprising:

a substrate comprising a non-porous material, having a first side and a second side, and defining at least two vias therethrough; and an electrically conductive material disposed in each of the vias and in direct contact with via sidewalls, wherein the electrically conductive material has been flowed through each open via in a molten state free of solid state material under conditions of elevated pressure and temperature, such that the electrically conductive material fills the at least two vias from at least one of the sides of the substrate, thereby forming at least two isolated regions of high electrical conductivity through the substrate.

16. The via disk of claim 15, wherein the substrate comprises alumina and the vias are formed by at least one of laser drilling, waterjet drilling, and mechanical drilling.

17. The via disk of claim 15, wherein the substrate comprises glass.

18. The via disk of claim 15, wherein the electrically conductive material is selected from the group consisting of aluminum, aluminum alloy, gold, silver, copper, and copper alloy.

19. The via disk of claim 15, wherein a surface of the substrate between the at least two vias is characterized by absence of electrically conductive material.

20. The via disk of claim 19, wherein exposed surfaces of the conductive material within the at least two vias are substantially coplanar with the surface of the substrate between the at least two vias.

21. The via disk of claim 15, wherein the via disk has a nominal diameter selected from the group consisting of 100 mm, 150 mm, 200 mm, 300 mm, and 450 mm.

22. The via disk of claim 15, wherein the via disk has a nominal thickness of about 0.5 mm to about 5 mm.

23. The via disk of claim 15, wherein the via disk has a surface roughness of up to about 0.8 micrometers $R_a$.

24. The via disk of claim 15, wherein the at least two vias have a nominal diameter of up to about 0.25 mm.

25. The via disk of claim 15, wherein the at least two vias have a length to diameter aspect ratio of up to about 1000:1.

26. The via disk of claim 15, further comprising a plurality of electrically conductive vias, arranged in a symmetrical array with via-to-via spacing of up to about 5 mm.

27. The via disk of claim 15, further comprising a bond pad electrically connected to at least one via.

28. The via disk of claim 15, further comprising a layer of conductive metal interconnect disposed on one side of the substrate in a predetermined pattern.

29. The via disk of claim 15, wherein the electrically conductive material disposed in at least one via exhibits an area of decreased conductivity proximate the substrate.

30. A probe card comprising the via disk of claim 15.

31. A space transformer comprising the via disk of claim 15.

32. The via disk of claim 15, wherein the electrically conductive material has been flowed into each open via in a molten state at a temperature of 800° C. or less.

33. The via disk of claim 15, wherein a resistivity of the conductive material is about one-tenth that of tungsten.

34. The via disk of claim 15, wherein the via sidewalls comprise a non-conductive material.

* * * * *

UNITED STATES PATENT AND TRADEMARK OFFICE

CERTIFICATE OF CORRECTION

PATENT NO. : 8,242,382 B2
APPLICATION NO. : 12/362693
DATED : August 14, 2012
INVENTOR(S) : Willibrordus Gerardus Maria van den Hoek et al.

It is certified that error appears in the above-identified patent and that said Letters Patent is hereby corrected as shown below:

On the title page, item (75), “Inventors:”

“Willibrordus G. van den Hoek” should read as follows:
--Willibrordus Gerardus Maria van den Hoek--.

Signed and Sealed this
Thirtieth Day of October, 2012

David J. Kappos
*Director of the United States Patent and Trademark Office*